United States Patent [19]
Yu

[11] Patent Number: 6,162,698
[45] Date of Patent: Dec. 19, 2000

[54] METHOD OF MANUFACTURING A CAPACITOR IN A SEMICONDUCTOR DEVICE

[75] Inventor: Yong Sik Yu, Ichon, Rep. of Korea

[73] Assignee: Hyundai Electronics Industries Co., Ltd., Ichon-shi, Rep. of Korea

[21] Appl. No.: 09/105,278

[22] Filed: Jun. 26, 1998

[30] Foreign Application Priority Data

Jun. 28, 1997 [KR] Rep. of Korea ........................ 97-28697
Jun. 28, 1997 [KR] Rep. of Korea ........................ 97-28698

[51] Int. Cl.[7] .................................................... H01L 21/20
[52] U.S. Cl. ........................... 438/399; 438/253; 257/306
[58] Field of Search .................................... 438/399, 396, 438/253, 256; 253/306, 303

[56] References Cited

U.S. PATENT DOCUMENTS

| | | |
|---|---|---|
| 5,491,102 | 2/1996 | Desu et al. . |
| 5,508,953 | 4/1996 | Fukuda et al. . |
| 5,858,851 | 1/1999 | Yamagata et al. ........................ 438/396 |
| 5,913,117 | 6/1999 | Lee ........................................ 438/240 |

OTHER PUBLICATIONS

Lakeman, C.D.E., Rapid Thermal Processing of Sol–Gel Derived PZT 53/47 Thin Layers; Proceedings of the Ninth IEEE International Symposium on Applications of Ferroelectrics, 1994. P. 404–407.

*Primary Examiner*—Olik Chaudhuri
*Assistant Examiner*—Ginette Peralta
*Attorney, Agent, or Firm*—Jacobson, Price, Holman & Stern, PLLC

[57] ABSTRACT

This invention relates to a method of manufacturing a capacitor in a semiconductor device. When forming a capacitor, just after forming the first ferroelectric PZT layer, supply of a DC bias voltage is maintained for a few minutes under the RF plasma before a cooling process, wherein then the cooling speed is rapidly increased so that a fine structure of the first PZT layer is transformed in the second PZT layer having a grain boundary of orientation polarization in the vertical direction and the domain structure. Just after forming the first ferroelectric PZT layer, after the RF plasma supply is shut off, an annealing process is performed for 5–20 minute at its temperature and then the cooling process is performed within 30 degree Celsius per minutes so that a fine structure of the first PZT layer is transformed to the second PZT layer having a grain boundary of orientation polarization in the vertical direction. Accordingly, electric characteristic of a capacitor can improve by preventing deterioration due to the endurance limit and the aging of the ferroelectric film.

19 Claims, 10 Drawing Sheets

METHOD OF MANUFACTURING A CAPACITOR IN A SEMICONDUCTOR DEVICE

BACKGROUND OF THE INVENTION

1. Field of the Invention

This invention relates to a method of manufacturing a capacitor in a semiconductor device. In particular, it relates to a method of manufacturing a capacitor in a semiconductor device that can improve the electric characteristic of the capacitor by forming a ferroelectric thin film that has an orientation polarization structure so that the endurance limit is enhanced and the aging of the ferroelectric thin film is improved.

2. Description of the Related Prior Art

Generally, ferroelectric material such as $(Pb, Zr)TiO_3$ (hereinafter, referred to as a PZT) has hundreds to thousands of a dielectric constant at room temperature and has bistable remanent polarization. A nonvolatile memory device can be obtained by forming the ferroelectric material in the form of a thin film.

The nonvolatile memory device formed by the ferroelectric thin film utilizes the principle that a signal is input thereon by controlling polarization direction according to the direction of the applied electric field and digital signals 1 and 0 are stored thereon in response to direction of the remanent polarization when the electric field is removed.

In a method of manufacturing the ferroelectric thin film such as a PZT, a physical vapor deposition method is more widely used than a chemical vapor deposition method since the physical vapor deposition method is interchangeable with a conventional semiconductor process and can produce a reliable device having a good quality in contrast to the chemical vapor deposition method.

In the physical vapor deposition method, the radio frequency (RF) plasma sputtering method is mainly used.

However, use of the ferroelectric thin film has been delayed in application of a memory device due to deterioration of the ferroelectric thin film. This means a default such as an oxygen void which is space charge exists in the thin film. Such a default is moved to a grain boundary or domain wall, thereby forming a space charge layer. The space charge layer forms an electric field in the opposite direction of a self polarization, resulting in decreased polarization.

That is, such a ferroelectric thin film has a polybound and has an irregular domain wall. When the direction of the polarization is changed by application of an electric field, the default bipolar has a direction which is different from the polarization direction which induced a reverse bias. Also, the default bipolar disturbs movement of the domain wall and the dielectric characteristic is deteriorated. Hence, there is a problem in that the ferroelectric thin film has been delayed in the application to a memory device.

SUMMARY OF THE INVENTION

Therefore, it is an object of the present invention to provide a method of manufacturing a capacitor in a semiconductor device which can solve the above problem and improve the electric characteristic of a capacitor by deterioration due to endurance limit and ageing of a ferroelectric thin film.

Another object of the present invention is to provide a method of manufacturing a capacitor in a semiconductor device that can improve reliability and yield of a semiconductor device by improving the electric characteristic of a capacitor.

BRIEF DESCRIPTION OF THE DRAWINGS

For a full understanding of the nature and objects of the present invention, reference should be made to the following detailed descriptions made in conjunction with the accompanying drawings in which.

Similar reference characters refer to similar parts through the several views of the drawings.

DETAILED DESCRIPTION OF THE INVENTION

Below, a method of manufacturing a capacitor in a semiconductor device according to the present invention will be explained with reference to the attached drawings.

FIGS. 1 through 10 illustrate sectional views showing steps of manufacturing a capacitor of a semiconductor device according to a first embodiment of the present invention.

Figure 1:
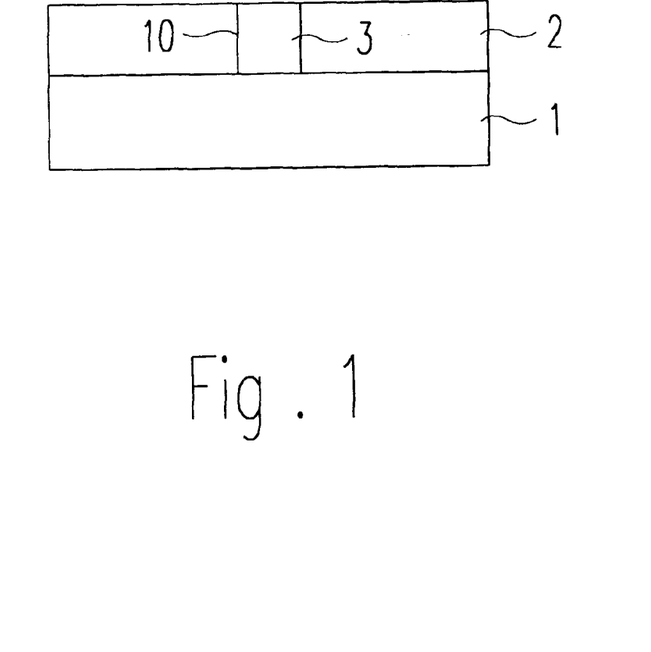
FIGS. 1 through 10 illustrate sectional views showing steps of manufacturing a capacitor of a semiconductor device according to a first embodiment of the present invention.

Referring to FIG. 1, an insulation layer 2 is formed on a lower substrate 1 and a contact hole 10 is formed on a predetermined portion of the insulation layer 2 where a capacitor will be positioned to form a vertical wire between the lower substrate 1 and the capacitor.

Thereafter, a polysilicon layer 3 is deposited with a thickness of 50 through 3000 Å by means of a chemical vapor deposition (CVD) on the entire structure after forming the contact hole 10.

The polysilicon layer 3 is blank etched so that the poly silicon layer 3 remains only within the contact hole 10 and is completely removed at the other position.

Figure 2:
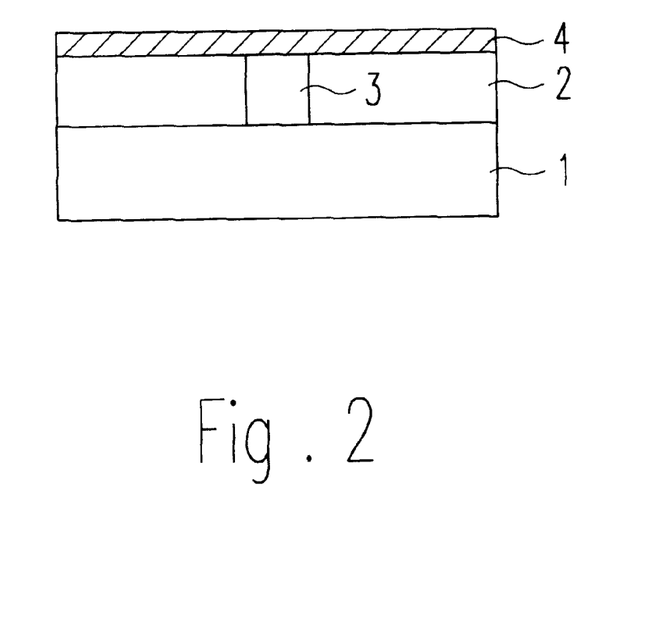

As shown in FIG. 2, a Ti layer 4 is formed on the entire surface of the substrate with thickness of 100 through 1000 Å.

Figure 3:
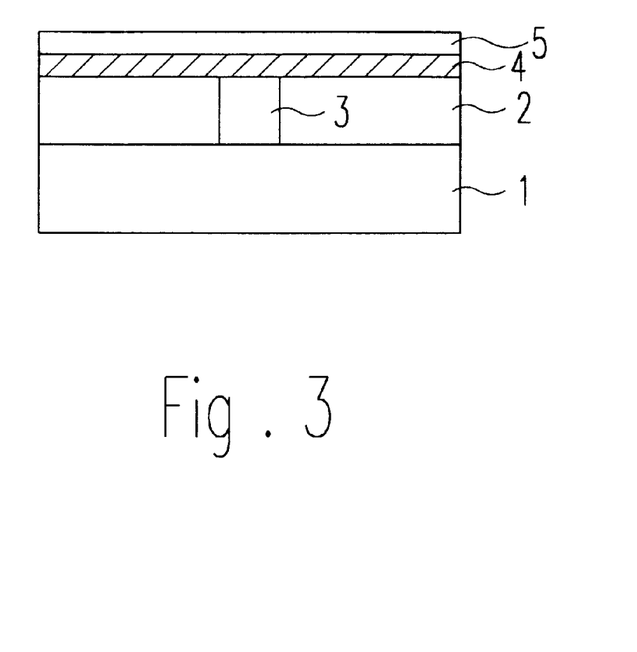

As shown in FIG. 3, a TiN layer 5 is formed on the Ti layer 4 with thickness of 200 through 2000 Å.

In the mean time, in the above processes as shown in FIG. 2 and FIG. 3, Ti and TiN can be substituted with Ta and TaN or W and WN.

Also, in the above processes as shown in FIG. 2 and FIG. 3, Ti and TiN can be substitute for Ti and TiSiN or Ta and TaSiN.

Figure 4:
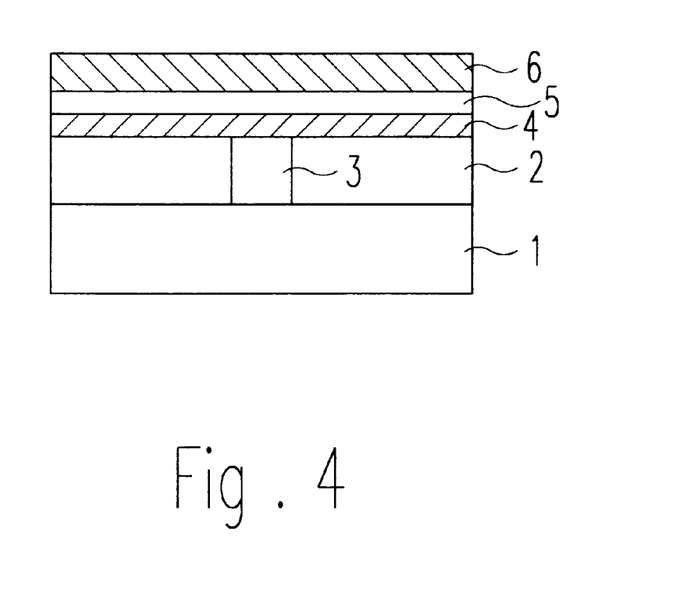

As shown in FIG. 4, a Pt layer 6 is deposited on the entire surface of the TiN layer 5 with thickness of 1000 through 5000 Å.

At this time, it is possible to deposit a ruthenium layer, which can be used for the oxygen diffusion prevention layer, instead of the Pt layer 6 which is used for a lower electrode, with thickness of 100 through 1000 Å; and a ruthenium dioxide ($RuO_2$) layer which is a conductive oxidation material is then deposited thereon. In this case, the ruthenium layer may be used for the upper electrode.

Figure 5:
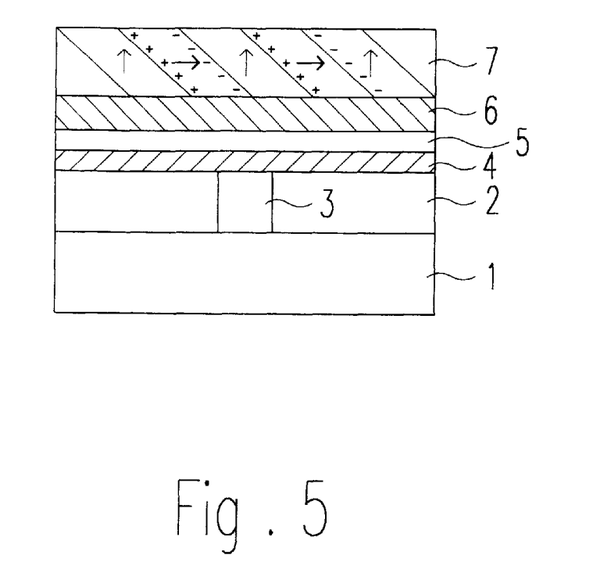

As shown in FIG. 5, a ferroelectric PZT layer 7 is deposited on the Pt layer 6 with a thickness of 500 through 2000 Å by the RF sputtering method at a temperature of 300 to 700 degrees Celsius.

Figure 6:
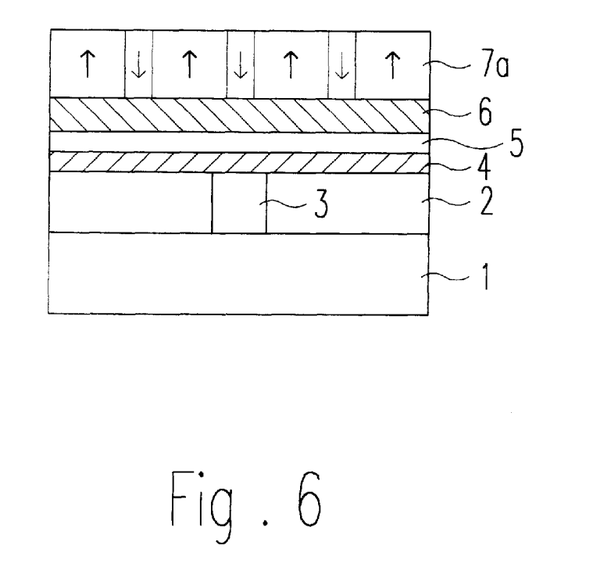

As shown in FIG. 6, just after forming the ferroelectric PZT layer 7, supply of DC bias voltage is maintained for a few minutes under the RF plasma prior to performing a cooling process. Therefore, the cooling speed is rapidly increased so that a fine structure of the PZT layer 7 is transformed into the other PZT layer 7a having a grain boundary of orientation polarization in the vertical direction and a domain structure.

Figure 7:
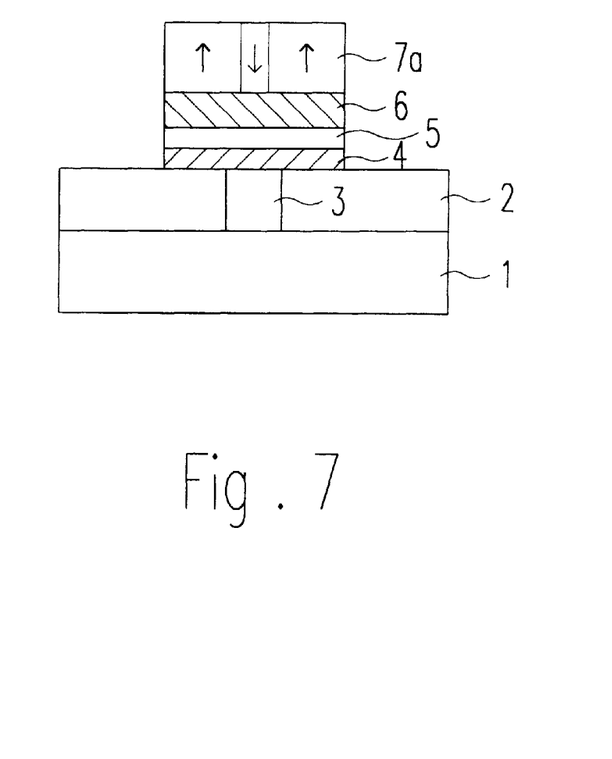

As shown in FIG. 7, the PZT layer 7a, the lower layer 6, the TiN layer 5 and Ti layer 4 are selectively removed by means of a photo mask/dry etching process during the same time.

Figure 8:
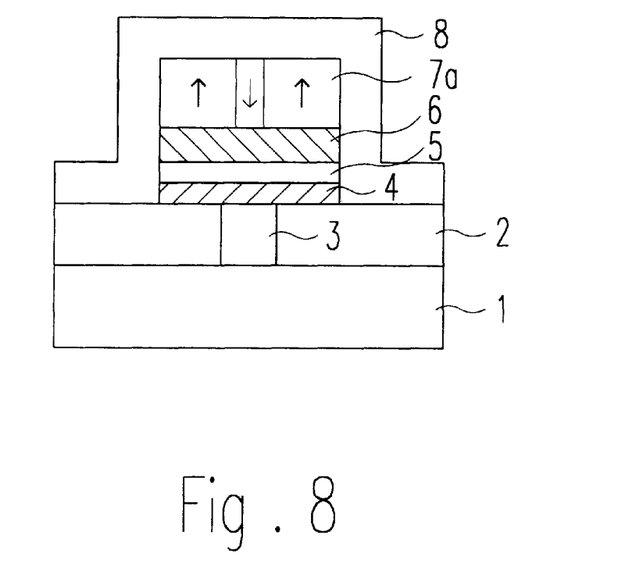

As shown in FIG. 8, a silicon oxidation layer 8 is formed with a predetermined thickness on the entire structure by means of the CVD method.

Figure 9:
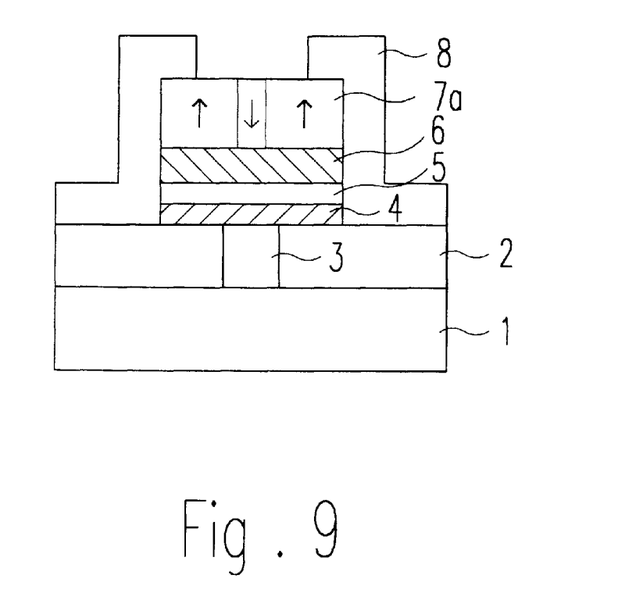

As shown in FIG. 9, the silicon oxidation layer 8 is selectively etched by means of a photo mask/dry etching process so that the upper surface of the PZT layer 7a is exposed.

Figure 10:
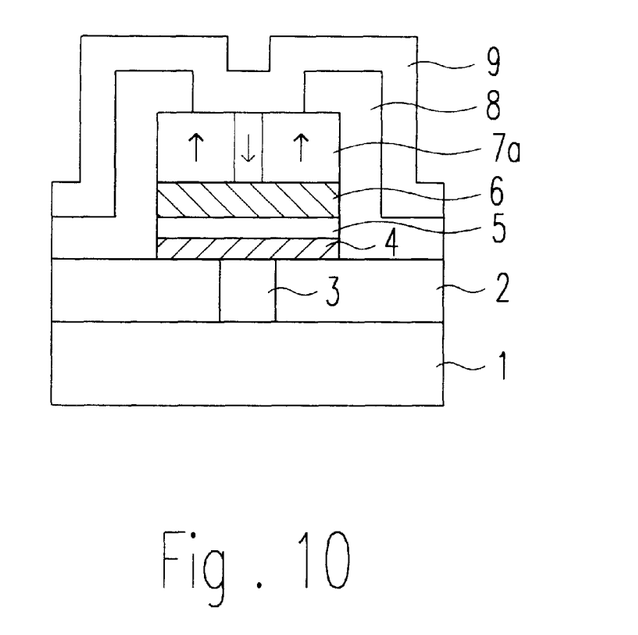

As shown in FIG. 10, a platinum (Pt) layer is formed on the entire structure with thickness of 500 through 2000 Å so that an upper electrode 9 is formed.

A method of manufacturing a capacitor in a semiconductor device according to a second embodiment of the present invention will be explained with reference to FIG. 11.

FIGS. 11 through 20 illustrate a sectional view for explaining steps of manufacturing a capacitor of a semiconductor device according to a second embodiment of the present invention.

Figure 11:
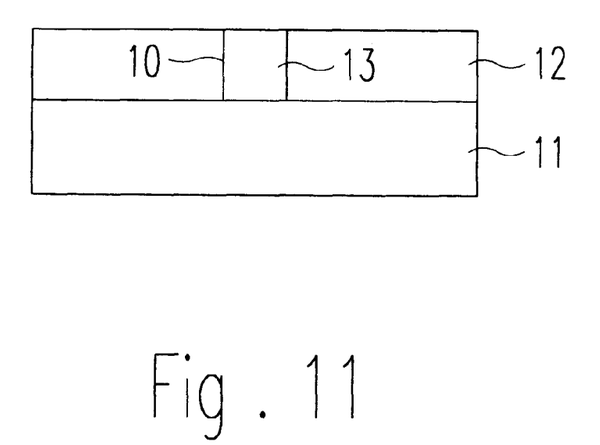
FIGS. 11 through 20 illustrate a sectional view for explaining steps of manufacturing a capacitor of a semiconductor device according to a second embodiment of the present invention.

Referring to FIG. 11, an insulation layer 12 is formed on a lower substrate 11 and a contact hole 10 is formed on a predetermined portion of the insulation layer 12 where a capacitor will be positioned to form a vertical wire between the lower substrate 11 and the capacitor.

Thereafter, a polysilicon layer 13 is deposited with a thickness of 50 through 3000 Å by means of a chemical vapor deposition (CVD) on the entire structure after forming the contact hole 10.

The polysilicon layer 13 is blanket etched so that the poly silicon layer 13 remains only within the contact hole 10 and is completely removed at the other positions.

Figure 12:
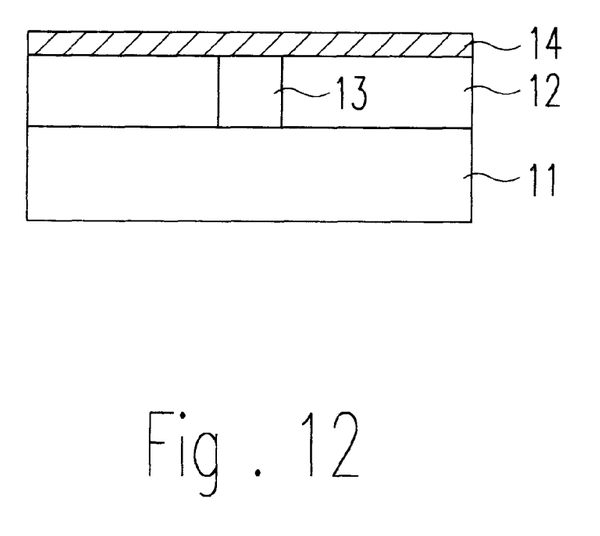

As shown in FIG. 12, a Ti layer 14 is formed on the entire surface of the substrate with thickness of 100 through 1000 Å.

Figure 13:
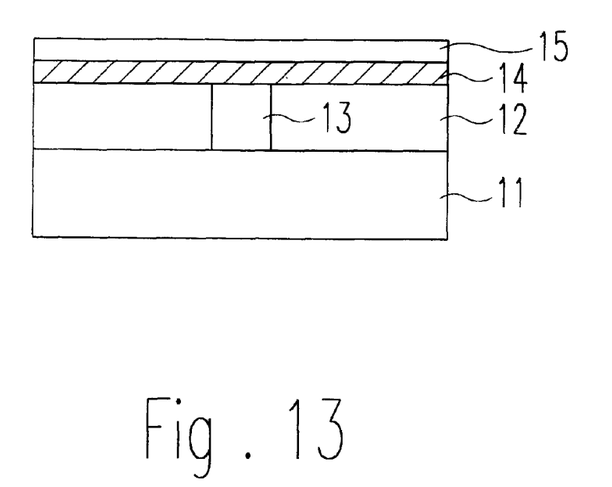

As shown in FIG. 13, a TiN layer 15 is formed on the Ti layer 14 with thickness of 200 through 2000 Å.

In the mean time, in the above processes as shown in FIG. 12 and FIG. 13, Ti and TiN can be substituted with Ta and TaN or W and WN.

Also, in the above processes as shown in FIG. 12 and FIG. 13, Ti and TiN can be substitute for Ti and TiSiN or Ta and TaSiN.

Figure 14:
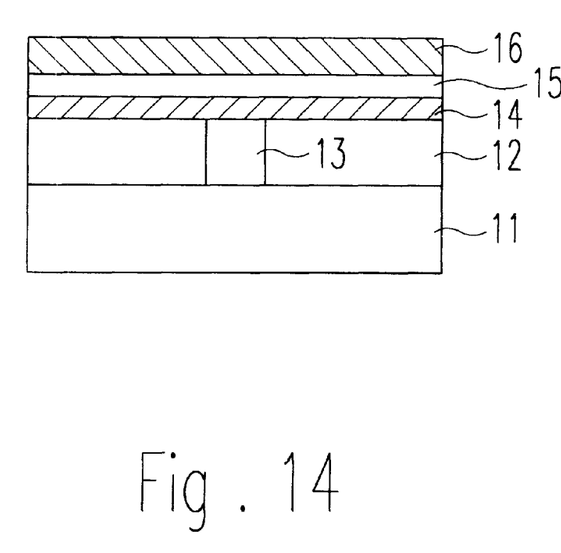

As shown in FIG. 14, a Pt layer 16 is deposited on the entire surface of the TiN layer 15 with thickness of 1000 through 5000 Å.

At this time, it is possible to deposit a ruthenium layer, which can be used for the oxygen diffusion prevention layer instead of the Pt layer 16 which is used for a lower electrode, with thickness of 100 through 100Å; a ruthenium dioxide (RuO$_2$) layer which is a conductive oxidation material is then deposited with thickness of 500 through 5000 Å, thereon. In this case, the ruthenium layer may be used for the upper electrode.

Figure 15:
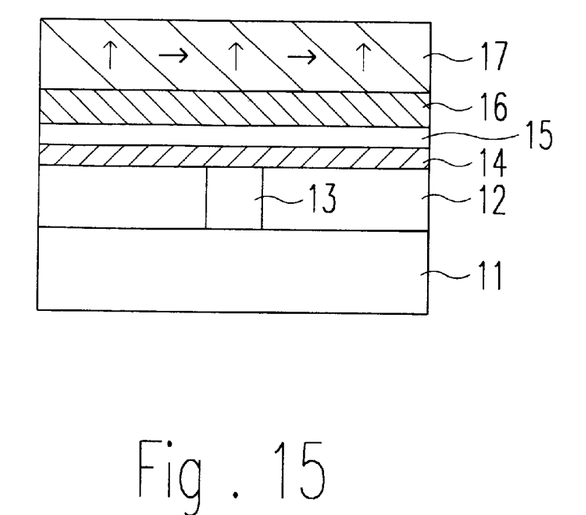

As shown in FIG. 15, a ferroelectric PZT layer 17 is deposited on the Pt layer 16 with thickness of 1000 through 3000 Å by the RF sputtering method at temperature of 300 to 700 degree Celsius.

Figure 16:
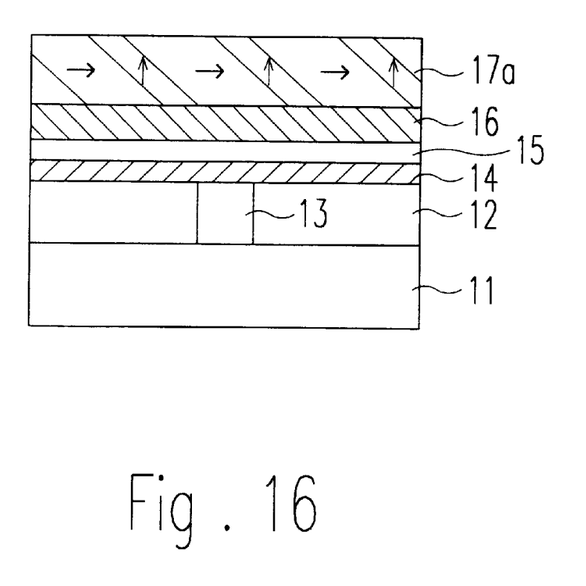

As shown in FIG. 16, just after forming the ferroelectric PZT layer 17, after the RF plasma supply is shut off, an annealing process is performed for 5–20 minutes at its temperature and then the cooling process is performed below a temperature of 30 degree Celsius per minute so that a fine structure of the PZT layer 17 is transformed into the other PZT layer 17a having a grain boundary of orientation polarization in the vertical direction.

Figure 17:
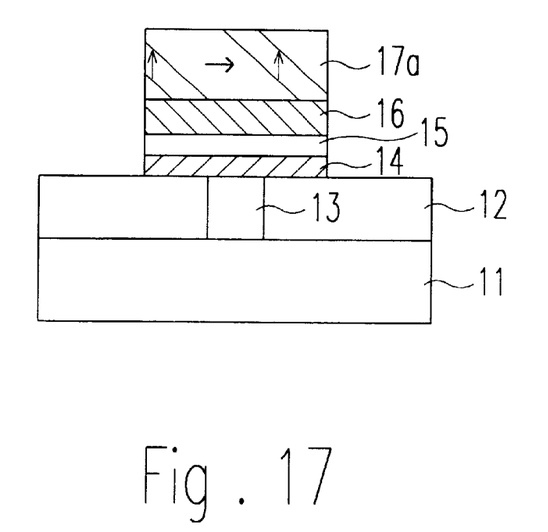

As shown in FIG. 17, the PZT layer 17a, the lower layer 16, the TiN layer 15 and Ti layer 14 are selectively removed by means of a photo mask/dry etching processes during the same time.

Figure 18:
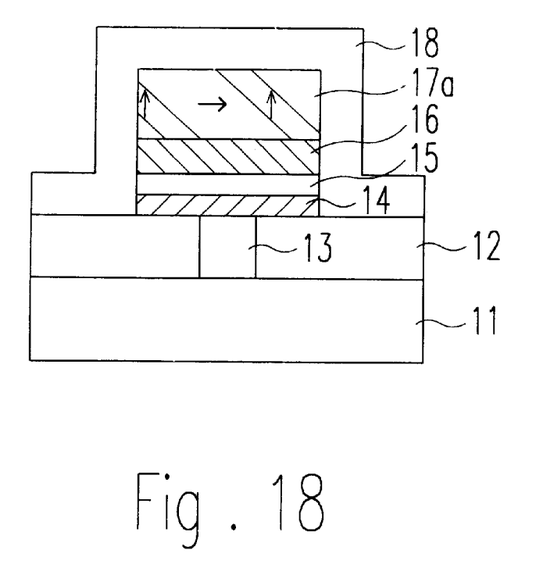

As shown in FIG. 18, a silicon oxidation layer 18 is formed with a predetermined thickness on the entire structure by means of the CVD method.

Figure 19:
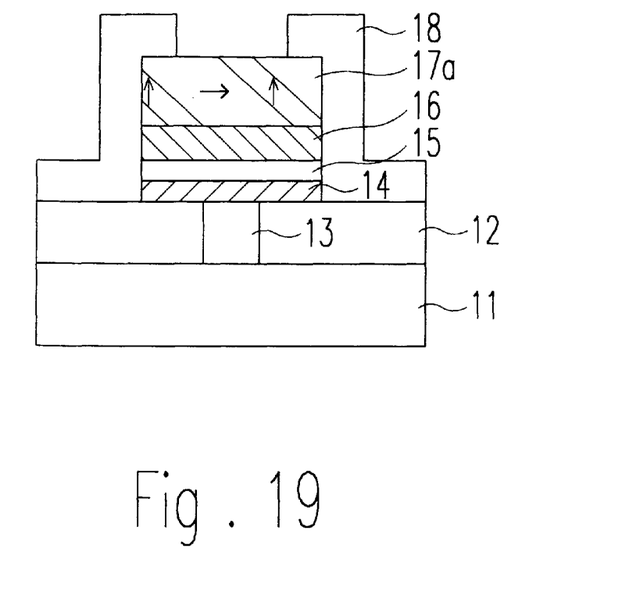

As shown in FIG. 19, the silicon oxidation layer 18 is selectively etched by means of a photo mask/dry etching processes so that the upper surface of the PZT layer 17a is exposed.

Figure 20:
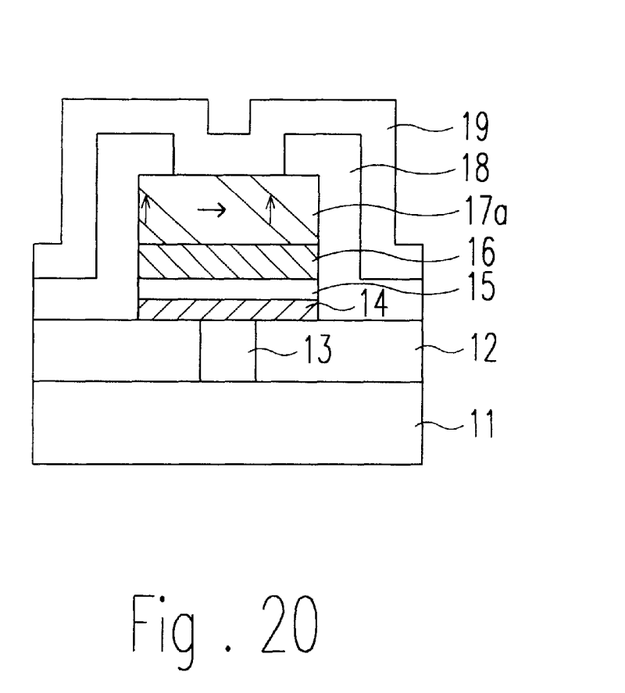

As shown in FIG. 20, a platinum (Pt) layer is formed on the entire structure with thickness of 500 through 2000 Å so that an upper electrode 19 is formed.

As described above, a method of manufacturing a capacitor in a semiconductor device according to the present invention has a following effect.

In the method of manufacturing a capacitor in a semiconductor device according to the present invention, a fine structure of the PZT layer is controlled to be a structure having a grain boundary of orientation polarization in the vertical direction or the horizontal direction and the domain structure, whereby the electric characteristic of a capacitor can be improved by preventing the deterioration due to the endurance limit and the aging of a PZT film by charge trapping. Although this invention has been described in its preferred form with a certain degree of particularity, it is appreciated by those skilled in the art that the present disclosure of the preferred form has been made only by of way example and that numerous changes in the details of the construction, combination and arrangement of parts may be resorted to without departing from the spirit and scope of the invention.

What is claimed is:

1. A method of manufacturing a capacitor in a semiconductor device comprising:

providing a lower substrate on which an insulation layer is formed;

forming a contact hole for a wire on a selected portion of said insulation layer;

forming a wiring plug by depositing a polysilicon layer within said contact hole;

forming a diffusion prevention layer, which is composed of Ti/TiN layers, on an exposed portion of said wiring plug and said insulation layer;

forming a lower electrode, which is composed of a Pt layer, on said diffusion prevention layer;

forming a ferroelectric PZT layer on said Pt layer;

after forming said ferroelectric PZT layer, transforming a fine structure of said ferroelectric PZT layer into a domain structure and structure having a grain boundary of orientation polarization in a vertical direction of said lower substrate by maintaining said ferroelectric PZT layer for a few minutes under a RF plasma generated by supply of a DC bias voltage and, after maintaining said ferroelectric PZT layer under said RF plasma, performing a cooling process;

forming a silicon oxidation layer over a resulting structure;

selectively etching said silicon oxidation layer to expose said ferroelectric PZT layer by means of a photo mask and dry etching method; and forming an upper electrode over an exposed portion of an entire structure.

2. The method of claim 1, wherein said Ti/TiN layers for said diffusion prevention layer is formed with thickness of 300 through 3000 Å.

3. The method of claim 1, wherein said diffusion prevention layer is formed with Ta/TaN layer instead of said Ti/TiN and formed with thickness of 300 through 3000 Å.

4. The method of claim 1, wherein said PT layer for said lower electrode is formed with a thickness of 500 through 5000 Å.

5. The method of claim 1, wherein a ruthenium layer is formed with thickness of 100 through 1000 Å and a ruthenium dioxide layer, which is conductive oxidation material, is formed thereon with thickness of 500 through 5000 Å instead of said Pt layer for said lower layer.

6. The method of claim 5, wherein said ruthenium dioxide layer is used for said upper electrode.

7. The method of claim 1, wherein said diffusion prevention layer is formed with one of Ti/TiSiN layers and Ta/TaSiN layers instead of said Ti/TiN, and formed with a thickness of 300 through 3000 Å.

8. The method of claim 1, wherein said ferroelectric PZT layer is formed with a thickness of 100 through 1000 Å.

9. The method of claim 1, wherein said upper electrode uses a Pt layer or a ruthenium dioxide layer.

10. A method of manufacturing a capacitor in a semiconductor device comprising:

providing a lower substrate on which an insulation layer is formed;

forming a contact hole for a wire on a selected portion of said insulation layer;

forming a wiring plug by depositing a polysilicon layer within said contact hole;

forming a diffusion prevention layer, which is composed of Ti/TiN layers, on an exposed portion of said wiring plug and said insulation layer;

forming a lower electrode, which is composed of a Pt layer, on said diffusion prevention layer;

forming a ferroelectric PZT layer on said lower layer using an RF plasma supply;

after forming said ferroelectric PZT layer, transforming a fine structure of said ferroelectric PZT layer into a structure having a grain boundary of orientation polarization in horizontal direction of said lower substrate by performing an annealing process for 5–20 minutes after the RF plasma supply used in forming said ferroelectric PZT layer is shut off, and performing a cooling process at a speed of 30 degrees Celsius or less per minute;

forming a silicon oxidation layer over a resulting structure;

selectively etching said silicon oxidation layer to expose said ferroelectric PZT layer by means of photo mask and dry etching methods; and forming an upper electrode over an exposed portion of the entire structure.

11. The method of claim 10, wherein said Ti/TiN layers for said diffusion prevention layer are formed with a thickness of 300 through 3000 Å.

12. The method of claim 10, wherein said diffusion prevention layer is formed with Ta/TaN layers instead of said Ti/TiN layers and formed with a thickness of 300 through 3000 Å.

13. The method of claim 10, wherein said Pt layer for said lower electrode is formed with a thickness of 500 through 5000 Å.

14. The method of claim 10, wherein a ruthenium layer is formed with thickness of 100 through 1000 Å and a ruthenium dioxide layer, which is a conductive oxidation material, is formed thereon with thickness of 500 through 5000 Å instead of said Pt layer for said lower layer.

15. The method of claim 14, wherein said ruthenium dioxide layer is used for said upper electrode.

16. The method of claim 10, wherein said diffusion prevention layer is formed with one of Ti/TiSiN layers and Ta/TaSiN layers instead of said Ti/TiN and formed with a thickness of 300 through 3000 Å.

17. The method of claim 10, wherein said ferroelectric PZT layer is formed with a thickness of 100 through 1000 Å.

18. The method of claim 1, wherein said upper electrode uses a Pt layer or a ruthenium dioxide layer.

19. A method of manufacturing a capacitor in a semiconductor device comprising:

providing a lower substrate on which an insulation layer is formed;

forming a contact hole for a wire on a selected portion of said insulation layer;

depositing a polysilicon layer with a thickness of 50 to 3000 Å by means of chemical vapor deposition;

blank etching the polysilicon layer so that the polysilicon layer remains only within the contact hole;

forming a diffusion prevention layer, which includes a Ti layer with a thickness of 100 to 1000 Å and a TiN layer with a thickness of 200 to 2000 Å, on an exposed portion of said insulation layer;

depositing a Pt layer having a thickness of 1000 to 5000 Å over the diffusion prevention layer to form a lower electrode;

forming a ferroelectric PZT layer on said Pt layer, said ferroelectric PZT layer being deposited with a thickness of 500 to 2000 Å by an RF sputtering method at a temperature of 300 to 700 degrees Celsius;

after forming said ferroelectric PZT layer, maintaining supply of DC bias voltage for a few minutes under the RF plasma to transform a fine structure of said ferroelectric PZT layer into a domain structure and structure having a grain boundary of orientation polarization in a vertical direction of said lower substrate;

performing a cooling process;

forming a silicon oxidation layer over a resulting structure;

selectively etching said silicon oxidation layer to expose an upper surface of said ferroelectric PZT layer by means of a photo mask and dry etching method; and forming a platinum layer with a thickness of 500 to 2000 Å over exposed portions of the resulting structure to form an upper electrode.

* * * * *